United States Patent
Maruyama et al.

(10) Patent No.: US 7,199,058 B2
(45) Date of Patent: Apr. 3, 2007

(54) METHOD OF MANUFACTURING A SEMICONDUCTOR DEVICE AND APPARATUS FOR MANUFACTURING A SEMICONDUCTOR DEVICE

(75) Inventors: Takuya Maruyama, Kanagawa (JP); Nobuaki Hamanaka, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 129 days.

(21) Appl. No.: 10/767,229

(22) Filed: Jan. 29, 2004

(65) Prior Publication Data

US 2004/0241928 A1    Dec. 2, 2004

(30) Foreign Application Priority Data

Jan. 29, 2003    (JP)    ............... 2003-021110

(51) Int. Cl.
*H01L 21/302* (2006.01)
*H01L 21/461* (2006.01)

(52) U.S. Cl. .............. 438/706; 438/708; 438/709; 438/710

(58) Field of Classification Search ........ 438/706, 438/708, 709, 710
See application file for complete search history.

(56) References Cited

U.S. PATENT DOCUMENTS

| 5,668,019 | A  | * | 9/1997 | Kobayashi et al. ......... 438/163 |
| 6,376,262 | B1 |   | 4/2002 | Kempa et al. |
| 6,703,285 | B2 | * | 3/2004 | Arakawa et al. ........... 438/396 |
| 6,919,259 | B2 | * | 7/2005 | Chang et al. ............... 438/421 |

FOREIGN PATENT DOCUMENTS

JP    2002-319619    10/2002

* cited by examiner

*Primary Examiner*—Chuong Anh Luu
(74) *Attorney, Agent, or Firm*—Katten Muchin Rosenman LLP

(57) ABSTRACT

Precision in an etching process is to be improved. A detecting unit 404 detects a variation of plasma emission intensity at a plurality of wavelengths (an emission band having an intensity peak in the proximity of 358 nm and an emission band having an intensity peak in the proximity of 387 nm) during a dry etching process being performed on either of a nitrogen-containing film formed on a semiconductor substrate or a non-nitrogen film provided in direct contact with the nitrogen-containing film in an etching apparatus 402. An arithmetic processing unit 406 performs calculation based on detected variation. A control unit 410 determines an endpoint of the dry etching process in consideration of the calculation result.

14 Claims, 14 Drawing Sheets

ETCHING ON INSULATING FILM

ETCHING ON ETCH-STOPPER FILM

METHOD OF MANUFACTURING A SEMICONDUCTOR DEVICE AND APPARATUS FOR MANUFACTURING A SEMICONDUCTOR DEVICE

This application is based on Japanese patent application NO. 2003-021110, the content of which is incorporated hereinto by reference.

BACKGROUND OF THE INVENTION

1. Field of the Invention

The present invention relates to a method of manufacturing a semiconductor device and an apparatus for manufacturing a semiconductor device, more specifically to a method of manufacturing a semiconductor device and an apparatus for manufacturing a semiconductor device including a process of removing a film of a semiconductor device by plasma dry etching.

2. Description of the Related Art

In compliance with the recent increasing demand for a higher integration of a semiconductor device, copper has come to be widely used as a material for an interconnect or a plug. Copper has the advantage of lower resistance and higher electromigration resistance than aluminum, which has been conventionally used.

On the other hand, copper is known to rapidly diffuse throughout an insulating film constituted of a silicon compound or the like. Accordingly, in case of employing copper as an interconnect material, usually a barrier metal layer and a diffusion barrier are provided, to respectively cover a lateral and a lower face and an upper face of the copper interconnect. Up to now SiN and so on have been popularly used as the diffusion barrier, however lately SiCN or the like having a low dielectric constant has come to be more widely used from the viewpoint of reducing crosstalk between interconnect lines (JP-A laid open 2002-319619, claim 5, Paragraph 0029). Also, the diffusion barrier also serves as an etch-stopper film when performing an etching process on an upper film.

However, despite utilizing such etch-stopper film it has been difficult to significantly improve production efficiency. FIGS. 12A to 12C are schematic cross-sectional views showing a process of removing by etching an interlayer insulating film 4 and an etch-stopper film 3 in a semiconductor device constituted of a first insulating film 1 in which a copper interconnect 2 is located, the etch-stopper film 3, the interlayer insulating film 4 and a resist film 5 layered in this sequence.

During a depositing process or a preliminary stage anterior to an etching process such as a CMP (chemical mechanical polishing) process of such a semiconductor device, a thickness of the interlayer insulating film 4 often varies depending on a depositing condition or a type of processing apparatus. Accordingly FIG. 12A represents a case where the interlayer insulating film 4 is relatively thin; FIG. 12B a case where the interlayer insulating film 4 has a normal thickness; and FIG. 12C a case where the interlayer insulating film 4 is too thick. Conventionally an etching process of the interlayer insulating film 4 and the etch-stopper film 3 has been performed for a predetermined fixed duration of time. In case where a duration of the etching process is fixed based on the semiconductor device shown in FIG. 12B, in the semiconductor device of FIG. 12A which has the thin interlayer insulating film 4 even the etch-stopper film 3 is removed during the etching process of the interlayer insulating film 4, so that penetration of the SiCN film is caused. This leads to oxidation of a surface of the copper interconnect 2 in the etching process of the interlayer insulating film 4 or removing process of the resist film 5. An oxide thus produced incurs an increase of contact resistance or interconnect resistance. Even though the oxide can be removed by a wet etching process, the copper interconnect 2 suffers a loss of its mass. On the other hand, in case where the interlayer insulating film 4 is excessively thick as shown in FIG. 12C, the interlayer insulating film 4 is not sufficiently removed during the etching process thereof, and a residue remains. Therefore even after a subsequent etching process of the etch-stopper film 3, a residue thereof remains.

Besides, even though a constant film thickness is maintained, an etching performance may result excessive or insufficient depending on influence of a fluctuation in etching rate of the etching apparatus. As a result, a decline of yield due to the residue or dispersion of electric characteristics due to inconstant etching depth is incurred, thereby decreasing reliability of the semiconductor device.

Further, a via hole diameter etc. may vary depending on a depositing condition or an apparatus. When the via hole diameter is inconstant, plasma density in the via hole fluctuates during a plasma dry etching process thereby causing a partial deviation of etching rate, which leads to the same problem of excessive etching or etching residue.

For the purpose of solving such problems, U.S. Pat. No. 6,376,262 discloses a technique of stopping an etching at a point where luminous intensity of 387 nm decreases when removing by etching a nitride film formed on a TEOS (tetraethylorthosilicate) film. This technique can reduce possibility of an excessive etching that may be caused by a difference of a film thickens or etching apparatus characteristics.

However, in case where an SiCN film or an SiON film is used as an etch-stopper film, the luminous intensity at the wave length of 387 nm during the etching originating from N declines because of a low nitrogen density in such films. Therefore, a sufficient luminous intensity for detection may not be obtained by an endpoint detection at a single wavelength. Also, even when an SiN film is used as the etch-stopper film, it is still difficult to precisely determine an endpoint by detection at a single wavelength alone. Furthermore since aluminous intensity peak based on CO is located around 387 nm, it is difficult to capture a change of luminous intensity originating from N by detection based only on the luminous intensity of 387 nm.

SUMMARY OF THE INVENTION

The present invention has been conceived in view of the foregoing situation, with an object to provide a technique of improving precision of an etching process for removing a film by plasma dry etching. It is another object of the present invention to provide a technique of precisely determining an etching endpoint in a semiconductor device including a nitrogen-containing film and a non-nitrogen film provided adjacent to the nitrogen-containing film.

According to the present invention, there is provided a method of manufacturing a semiconductor device, comprising forming a film on a semiconductor substrate; performing a dry etching process for removing the film while monitoring a plasma emission at a plurality of wavelengths; wherein the step of performing the dry etching process includes determining an endpoint of the dry etching process based on a change of intensity of the plasma emission at the plurality of wavelengths.

By such method, since an endpoint of the dry etching process is determined based on a change of the plasma emission intensity at the plurality of wavelengths, the etching endpoint can be precisely determined even though intensity variation at each single wavelength is scarce. Consequently, an excessive etching in an interconnect trench or a via hole can be prevented, and control of interconnect resistance becomes easier. Also, even in case where a thickness of an etch-stopper film or a insulating film on or under the etch-stopper film is not constant, an etching process can be precisely performed since an etching endpoint can be individually determined according to a thickness of each film. As a result, dispersion in precision and dimensions of a semiconductor device can be minimized, thereby enhancing reliability of the product.

In the method of manufacturing a semiconductor device of the present invention, each of the plurality of wavelengths may be in an emission band having a peak where the luminous intensity changes while performing the dry etching of the film.

In case where luminous intensity of all of the plurality of wavelengths change, an endpoint for finishing the dry etching can be clearly detected. Also, in case where the luminous intensity of a wavelength increases and that of another wavelength decreases, the endpoint of the dry etching may be determined based on a total of the absolute values of the intensity changes of the respective wavelengths. This also enables performing a precise etching process.

In the method of manufacturing a semiconductor device of the present invention, the film may contain nitrogen. Also, in the method of the present invention the film may contain SiCN or SiON. Here, the SiCN refers to a compound containing Si, C, N and H and constituted of a combination of at least two thereof. Likewise, the SiON refers to a compound containing Si, O, N and H and constituted of a combination of at least two thereof. Especially in case where the film contains either SiCN or SiON a nitrogen content in the film is not sufficient, however a precise etching process can still be performed by determining the endpoint of the dry etching based on a change of plasma emission intensity at the plurality of wavelengths.

In the method of manufacturing a semiconductor device of the present invention, the film may be a insulating film provided on another film containing nitrogen in direct contact therewith. Also in the method of the present invention, the film may be a insulating film provided on another film containing SiCN or SiON in direct contact therewith.

In the method of manufacturing a semiconductor device of the present invention, the insulating film may be constituted not to contain nitrogen.

In the method of manufacturing a semiconductor device of the present invention, the plurality of different wavelengths may be an emission band having a luminous intensity peak in the proximity of 358 nm and in an emission band having a luminous intensity peak in the proximity of 387 nm. Here, the proximity of 358 nm may be defined as, for example, a range of 356 nm to 360 nm. Likewise, the proximity of 387 nm may be defined as a range of 385 nm to 389 nm, for example.

According to the present invention, there is provided a method of manufacturing a semiconductor device including a nitrogen-containing film formed on a semiconductor substrate and a film formed on the nitrogen-containing film in direct contact therewith, comprising performing a dry etching process for removing the film at least until reaching an interface with the nitrogen-containing film while monitoring plasma emission at a plurality of wavelength, wherein the step of performing the dry etching process includes determining an endpoint based on a change of intensity of the plasma emission at the plurality of wavelengths.

By such method, since an endpoint of the dry etching process is determined based on a change of the plasma emission intensity at the plurality of wavelengths, the etching endpoint can be precisely determined even though intensity variation at each single wavelength is scarce.

According to the present invention, there is provided a method of manufacturing a semiconductor device including a film formed on a semiconductor substrate and a nitrogen-containing film formed on the film in direct contact therewith, comprising performing a dry etching process for removing the nitrogen-containing film at least until reaching an interface with the film while monitoring plasma emission at a plurality of wavelength, wherein the step of performing the dry etching process includes determining an endpoint based on a change of intensity of the plasma emission at the plurality of wavelengths.

In the method of manufacturing a semiconductor device of the present invention, the film may be constituted not to contain nitrogen.

According to the present invention, there is provided an apparatus of manufacturing a semiconductor device comprising a detecting unit which detects a variation of intensity of plasma emission at each of a plurality of wavelengths during a dry etching process of one of a nitrogen-containing film provided on a semiconductor substrate and a non-nitrogen film provided indirect contact with the nitrogen-containing film; an arithmetic processing unit which executes arithmetic processing based on the detected variation; and a control unit which determines an endpoint of the dry etching process in consideration of the arithmetic processing result.

With such apparatus, since the arithmetic processing unit executes calculation based on variation of plasma emission intensity at a plurality of wavelengths, and the control unit determines an endpoint of the dry etching process in consideration of the arithmetic processing result, the etching endpoint can be precisely determined even though intensity variation at each single wavelength is scarce. Consequently, an excessive etching in an interconnect trench or a via hole can be prevented, and control of interconnect resistance becomes easier.

In the apparatus of manufacturing a semiconductor device of the present invention, the detecting unit can detect an emission band having a luminous intensity peak in the proximity of 358 nm and an emission band having a luminous intensity peak in the proximity of 387 nm.

According to the present invention, there is provided a method of manufacturing a semiconductor device, comprising the steps of: forming a film on a substrate; starting a dry etching of the film in a dry etching system; monitoring a plasma emission from the dry etching system; detecting an endpoint of the dry etching based on intensity of the monitored plasma emission at predetermined wavelengths; and ending the dry etching of the film, wherein intensity of at least two wavelengths is monitored at said monitoring the plasma emission.

And moreover according to the present invention, there is provided an apparatus of manufacturing a semiconductor device comprising: a dry etching unit for etching a film formed on a substrate; a monitoring unit for monitoring a plasma emission from the dry etching unit; and a detecting unit for detecting endpoint of the dry etching based on intensity of the monitored plasma emission at predetermined wavelengths, wherein said monitoring unit monitors intensity of at least two wavelengths.

DETAILED DESCRIPTION OF THE INVENTION

First Embodiment

The first embodiment represents a case where the present invention is applied to formation of a semiconductor device by single Damascene process.

Figure 1:
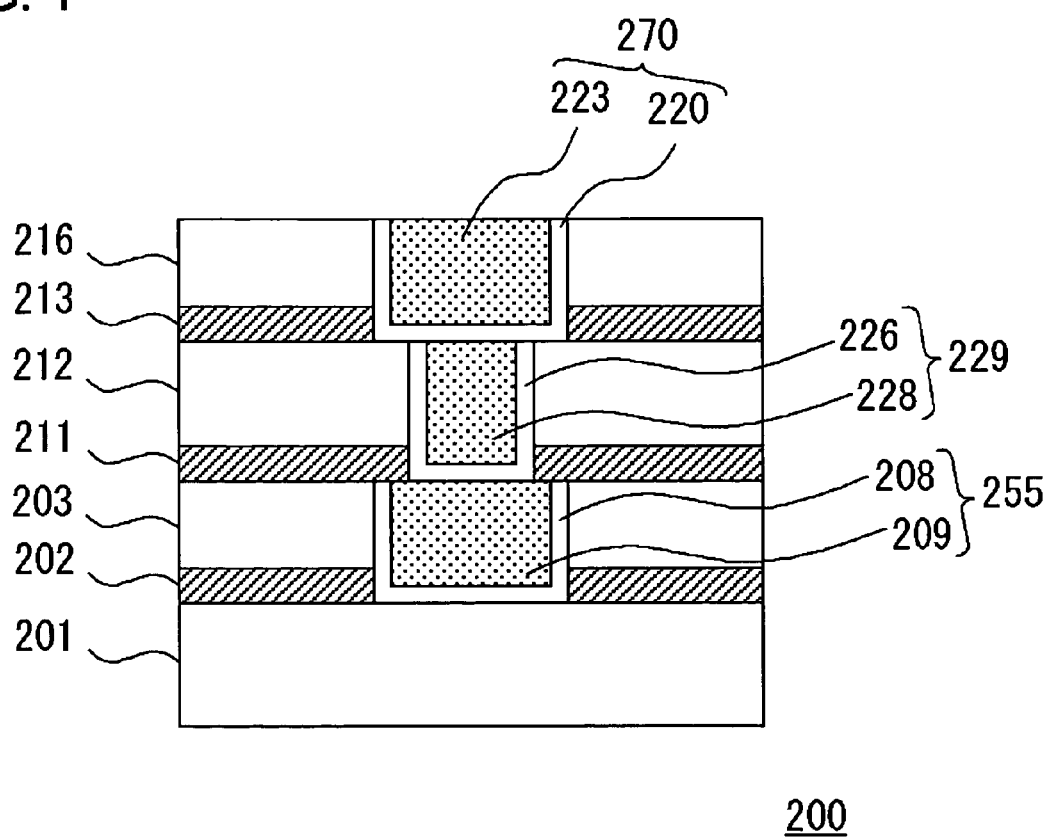
FIG. 1 is a schematic cross-sectional view showing a constitution of a semiconductor device according to an embodiment of the present invention.

FIG. 1 is a schematic cross-sectional view showing a constitution of a semiconductor device according to this embodiment.

A semiconductor device 200 in this embodiment is constituted of a underlying insulating film 201, an etch-stopper film 202 which is an SiCN film, a first insulating film 203, an etch-stopper film 211, an interlayer insulating film 212, an etch-stopper film 213 and a second insulating film 216 deposited in this sequence on a semiconductor substrate (not shown) on which a transistor and other elements are provided. A lower interconnect 255 constituted of a barrier film 208 and an interconnect metal film 209 is formed through the etch-stopper film 202 and the first insulating film 203, while an upper interconnect 270 constituted of a barrier film 220 and an interconnect metal film 223 is formed through the etch-stopper film 213 and the second insulating film 216. The lower interconnect 255 and the upper interconnect 270 are connected through a via plug 229 constituted of a barrier film 226 and a via metal film 228. Hereunder, a method of manufacturing such semiconductor device according to this embodiment will be described. FIGS. 2A to 2C and 3A to 3C are schematic cross-sectional views showing a manufacturing process of the via plug 229 in the semiconductor device shown in FIG. 1.

Figure 2A:
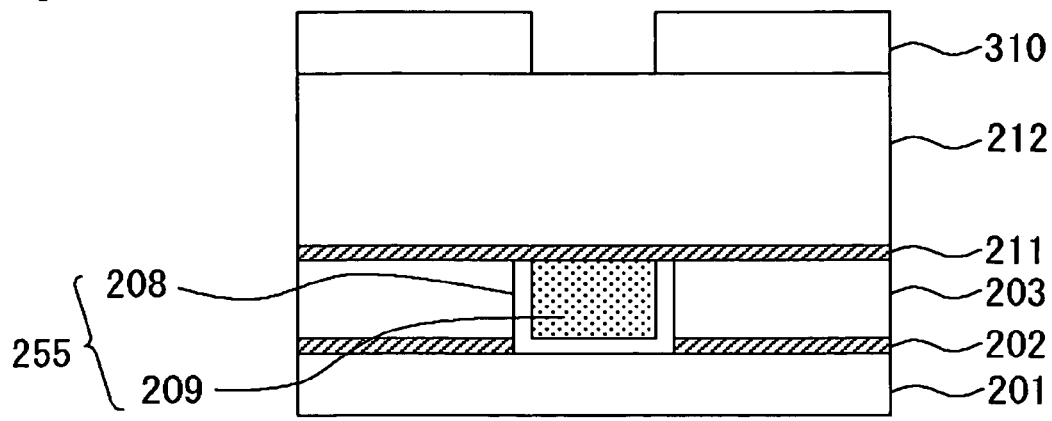
FIGS. 2A to 2C are schematic cross-sectional views showing a manufacturing process of a semiconductor device according to an embodiment of the present invention.

First, after performing an etching process on the etch-stopper film 202 and the first insulating film 203 to form an interconnect trench, the barrier film 208 and the interconnect metal film 209 are deposited. Then CMP (chemical mechanical polishing) is performed so as to form the lower interconnect 255 constituted of the interconnect metal film 209 with its lateral and bottom face covered with the barrier film 208. The etch-stopper film 211 is then deposited all over the substrate, which serves as a diffusion barrier film for a metal constituting the interconnect metal film 209 and as an etch-stopper. Thereafter the interlayer insulating film 212 is formed on the etch-stopper film 211, and further a resist film 310 provided thereon with an opening at a predetermined position is formed on the interlayer insulating film 212 (FIG. 2A).

The etch-stopper films 202, 211 and 213 (see FIG. 1) may be constituted of an SiCN film, an SiON film or an SiN film. Here below, a case where the etch-stopper films 202, 211 and 213 are constituted of an SiCN film will be described as an example.

The first insulating film 203 and the second insulating film 216 (see FIG. 1) may be constituted of for example an $SiO_2$ (silicon oxide) film. Also, the first insulating film 203 and the second insulating film 216 may be constituted of a low dielectric constant (hereinafter simply referred to as "low-k") material. Here, the low-k material may be defined as for example a material having a specific dielectric constant not greater than 3.6. A film containing a ladder oxide such as a ladder-type hydrosiloxane can be cited as an example of the low-k material. The ladder-type hydrosiloxane refers to a polymer that has a ladder-type molecular structure, and it is preferable to employ such one that has a dielectric constant not greater than 2.9 and a low film density, from the viewpoint of prevention of an interconnect delay. An L-Ox™ (trademark) can be cited as a specific example of such film material. Further, examples of the low-k material include a polyorganosiloxane such as HSQ (hydrogensilsesquioxane), MSQ (methylsilsesquioxane), MHSQ (methylhydrogensilsesquioxane), an organic material containing an aromatic substance such as PAE (polyarylether), divinyl-siloxane-bis-BCB (benzocyclobutene), Silk (registered trademark), also SOG (spin on glass), FOX (flowable oxide), Parylene, Cytop, BCB (benzocyclobutene), and so forth. Employing such materials effectively decreases interconnect capacitance. In addition, the first insulating film 203 may be constituted of one of such low-k materials with a protection film formed thereon made of for example an $SiO_2$ film.

The barrier films 208, 220 and 226 (see FIG. 1) may be constituted of for example Ta, TaN, Ti, TiN or layers thereof. Also, the interconnect metal film 209, the via metal film 228 and the interconnect metal film 223 (see FIG. 1) may be constituted of a film containing copper.

Figure 2B:
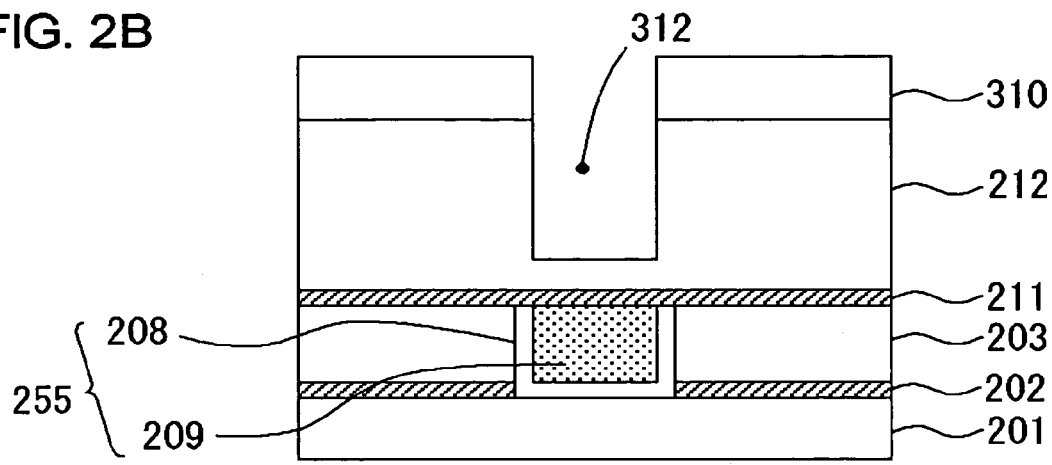
Figure 2C:
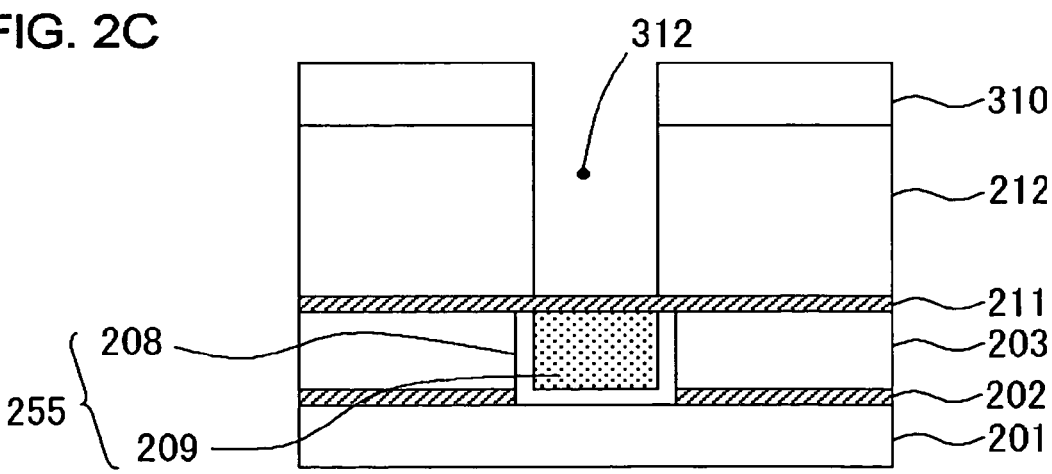

Back to the manufacturing process, an etching process is then performed on the interlayer insulating film 212 utilizing the resist film 310 as a mask, to form a via hole 312 (FIGS. 2B and 2C). The formation of the via hole 312 is controlled by an etching control system to be subsequently described. Upon performing plasma etching on an SiCN film, a plasma emission takes place at a wavelength originating from the nitrogen (N) contained in the SiCN film (an emission band having an intensity peak at approx. 356 nm to 360 nm and an emission band having an intensity peak at approx. 385 nm to 389 nm). Accordingly, when performing the plasma etching on the interlayer insulating film 212, formed over the etch-stopper film 211, to expose a surface of the etch-stopper film 211, an endpoint of the etching on the interlayer insulating film 212 can be determined in compliance with emergence of emission or an increase of intensity variation at approx. 358 nm and approx. 387 nm.

Figure 3A:
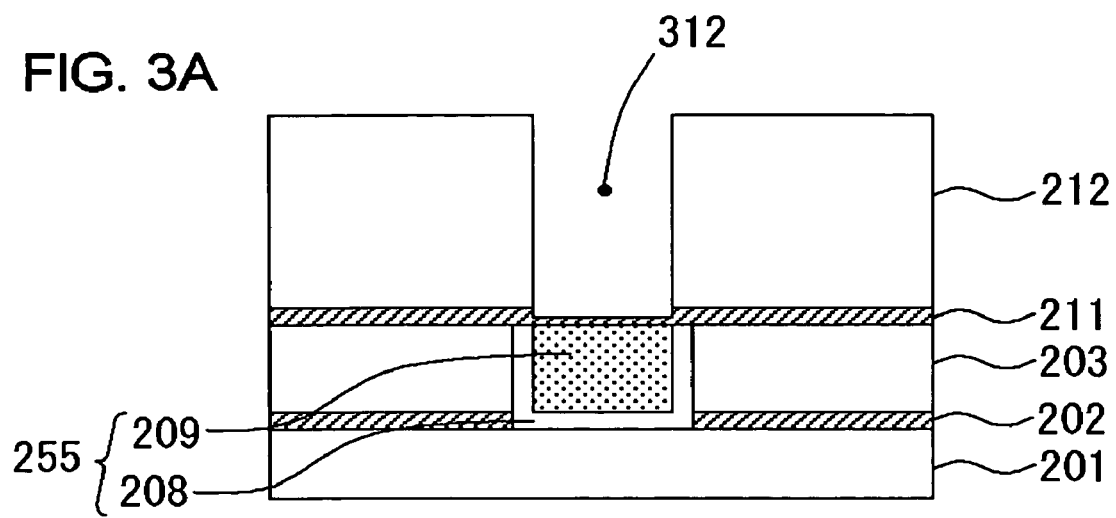
FIGS. 3A to 3C are schematic cross-sectional views showing a manufacturing process of a semiconductor device according to an embodiment of the present invention.
Figure 3B:
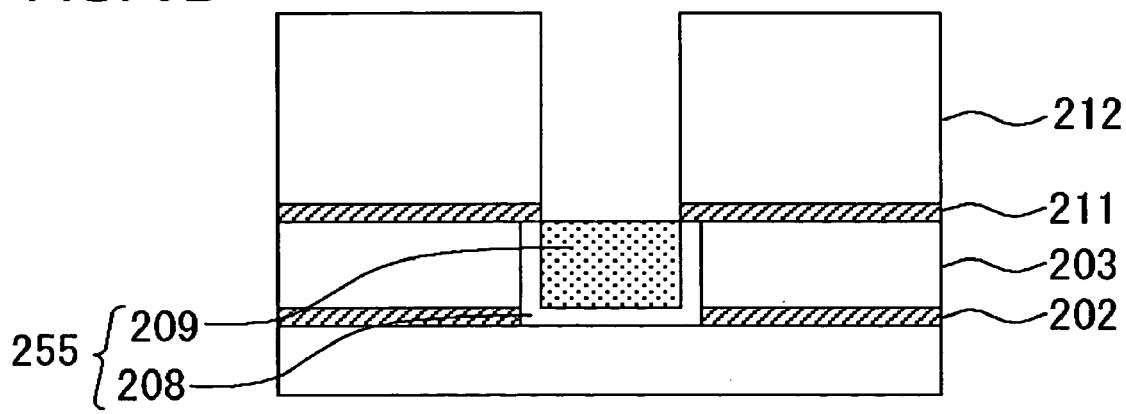

Then, after removing the resist film 310 by an oxygen plasma ashing process, an etch-back process is performed to remove the etch-stopper film 211 on the lower interconnect 255 (FIGS. 3A and 3B). When performing the etching process on the etch-stopper film 211 to expose a surface of the first insulating film 203, an endpoint of the etching on the etch-stopper film 211 can be determined in compliance with disappearance of emission or an decrease of intensity variation at approx. 358 nm and approx. 387 nm.

Figure 3C:
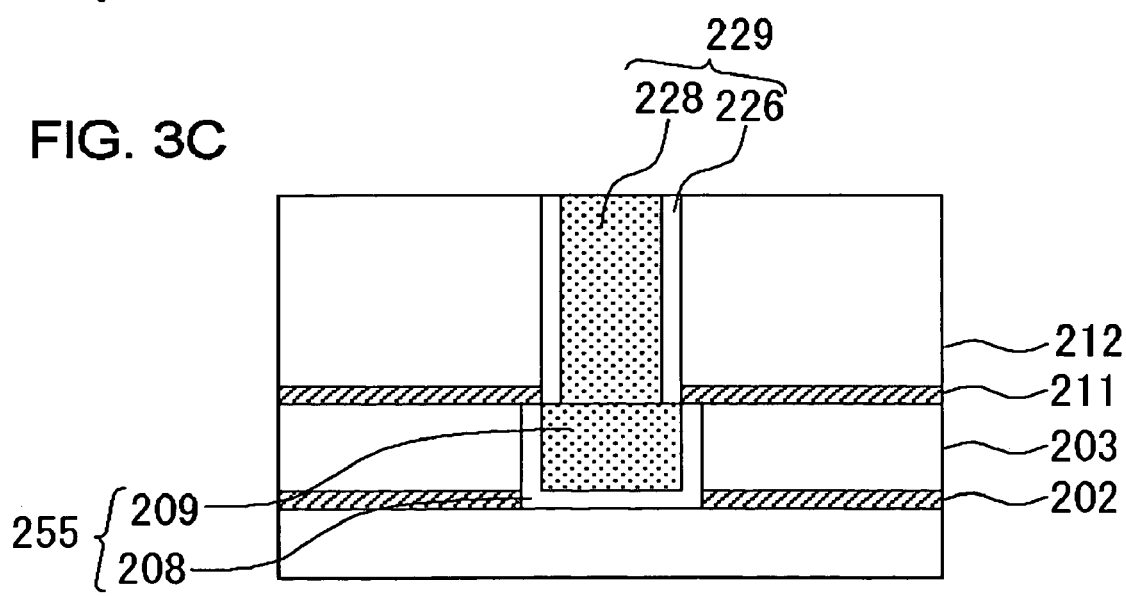

Following the above, the barrier film 226 and the via metal film 228 are deposited all over the substrate, after which a CMP process is performed to remove a surplus of the barrier film 226 and of the via metal film 228 located outside the via hole 312, thereby forming the via plug 229 connected to the lower interconnect 255 (FIG. 3C).

The foregoing passage refers to a formation method of the via plug 229, while the lower interconnect 255 and the upper interconnect 270 can also be formed in a similar manner. By repeating the foregoing process of forming a metal interconnect, and of providing a via plug one after another, manufacturing by single Damascene process of a semiconductor device provided with a multilayer interconnect structure including a desired number of layers can be executed.

Figure 4:
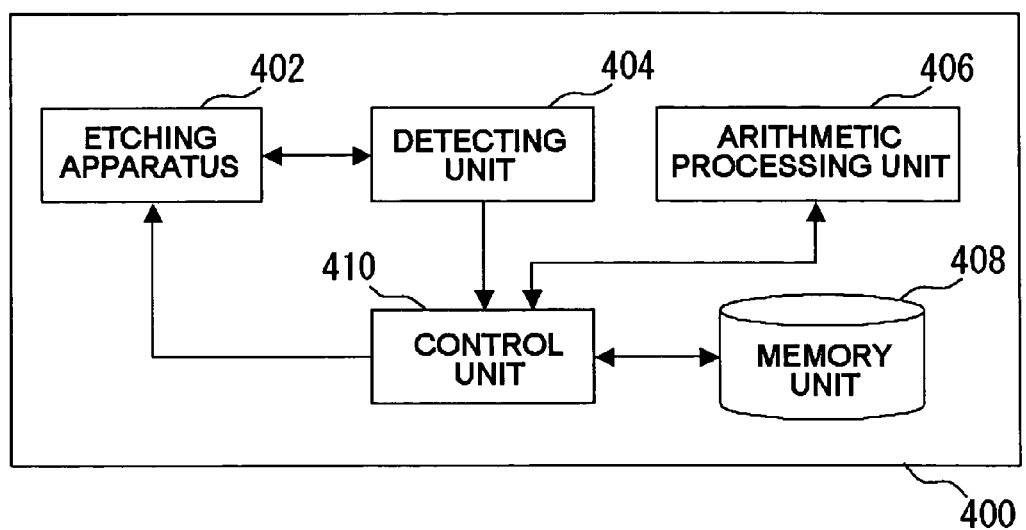
FIG. 4 is a block diagram showing a constitution of an etching control system according to an embodiment of the present invention.

FIG. 4 is a block diagram showing a constitution of an etching control system 400 according to this embodiment. The etching control system 400 is provided with an etching apparatus 402, a detecting unit 404, an arithmetic processing unit 406, a memory unit 408 and a control unit 410. The etching apparatus 402 is a known plasma etching apparatus, installed to execute a plasma etching process on various types of films. The etching apparatus 402 is provided with a window for detecting emission, though an optical sensor attached to the etching apparatus 402 constitutes a part of the detecting unit 404. The detecting unit 404 performs measurement by an OES (optical emission spectroscopy) process in a wavelength range of 175 nm to 525 nm during an etching process. The detecting unit 404 also detects plasma emission intensity at a plurality of wavelengths (in this embodiment an emission band that has an intensity peak in the proximity of approx. 356 nm to 360 nm, and an emission band that has an intensity peak at approx. 385 nm to 389 nm) during an etching process. The arithmetic processing unit 406 calculates luminous intensity at the plurality of wavelengths based on a detecting result obtained by the detecting unit 404. The memory unit 408 stores a memory of an appropriate time for finishing an etching process with respect to each sample to be detected. The control unit 410 receives data of a detection result from the detecting unit 404 and a calculation result from the arithmetic processing unit 406, and controls the etching apparatus 402 referring to the memory unit 408.

Figure 5A:
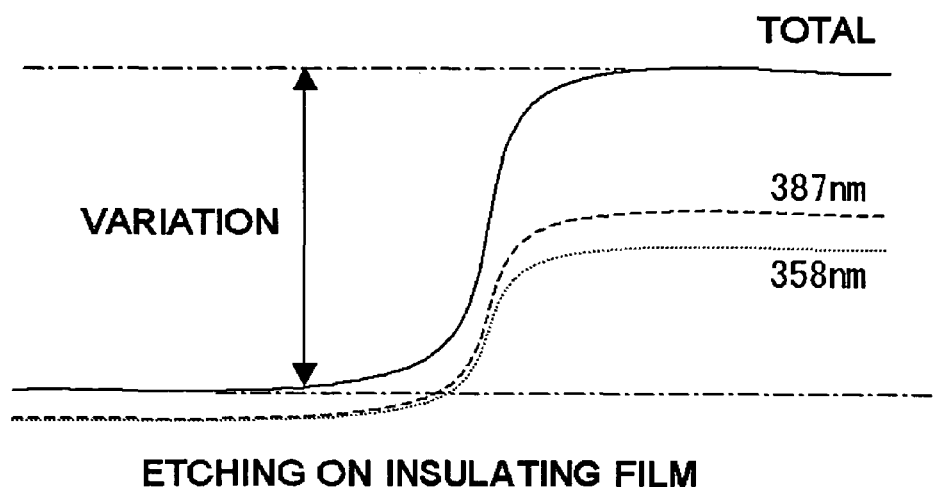
FIGS. 5A and 5B are line graphs conceptually showing a chronological variation of a plurality of specific wavelengths in an embodiment of the present invention.
Figure 5B:
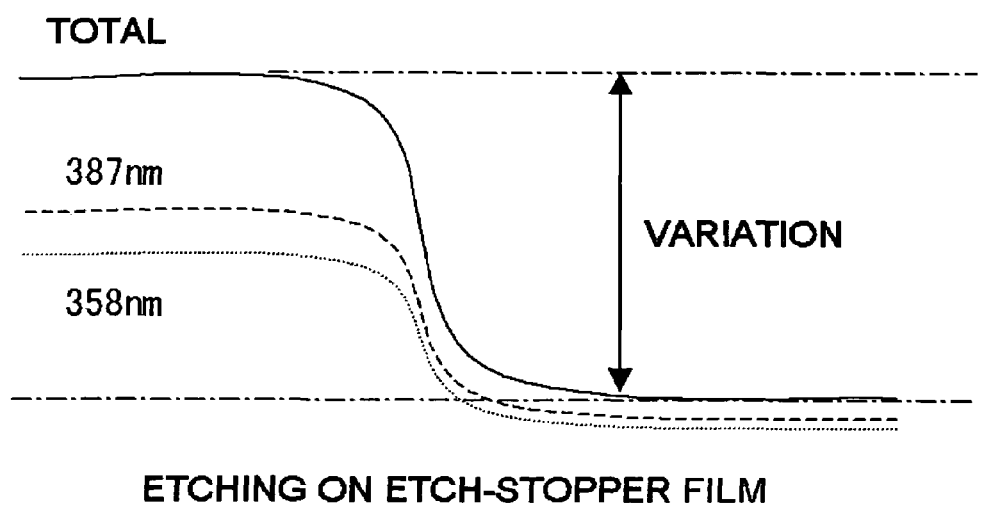

FIGS. 5A and 5B are line graphs conceptually showing a chronological variation of a plurality of specific wavelengths detected by the detecting unit 404 when deciding an etching endpoint of a insulating film formed on an etch-stopper film as well as an etching process of the etch-stopper film according to this embodiment.

According to this embodiment, the detecting unit 404 detects luminous intensity of two different wavelengths (approx. 358 nm and approx. 387 nm) originating from N contained in an SiCN film constituting an etch stopper film (specifically one of the etch-stopper films 202, 211 and 213). The arithmetic processing unit 406 calculates a total of the luminous intensity of these two wavelengths (approx. 358 nm and approx. 387 nm).

As shown in FIG. 5A, during an etching process of a insulating film (specifically one of the first insulating film 203, the interlayer insulating film 212 and the second insulating film 216), luminous intensity of the wavelengths of approx. 358 nm and approx. 387 nm respectively increases when the insulating film is removed and a surface of an etch-stopper film provided thereunder is exposed. The memory unit 408 can store an etching endpoint data, for example, as being a point where a total of luminous intensity variation of a plurality of wavelength from an initial luminous intensity reaches a predetermined value. The control unit 410 receives a calculation result from the arithmetic processing unit 406 and decides the etching endpoint of the insulating film referring to the memory unit 408. The control unit 410 controls, upon deciding the etching endpoint, the etching apparatus 402 according to the decided timing, to thereby finish the etching process of the insulating film.

On the other hand referring to FIG. 5B, during a etching process of an etch-stopper film, luminous intensity of the wavelengths of approx. 358 nm and approx. 387 nm respectively decreases when the etch-stopper film is removed and a surface of an insulating film provided thereunder is exposed. In this case also, the memory unit 408 can store an etching endpoint data as being a point where a total of luminous intensity variation of a plurality of wavelength from an initial luminous intensity reaches a predetermined value. The control unit 410 receives a calculation result from the arithmetic processing unit 406 and decides the etching endpoint of the etch-stopper film referring to the memory unit 408. The control unit 410 controls, upon deciding the etching endpoint, the etching apparatus 402 according to the decided timing, to thereby finish the etching process of the etch-stopper film.

According to this embodiment, since the arithmetic processing unit 406 calculates luminous intensity variation of a plurality of wavelengths and the control unit 410 decides an etching endpoint based on the calculation result, the etching endpoint can be precisely determined even though intensity variation at each single wavelength is scarce. Consequently, an excessive etching in an interconnect trench or a via hole can be prevented, and control of interconnect resistance becomes easier. Also, even in case where a thickness of an etch-stopper film or a insulating film on or under the etch-stopper film is not constant, the etching endpoint can be individually determined by the etching control system 400 according to a thickness of each film, thereby achieving high precision in the overall etching process.

Second Embodiment

The second embodiment represents a case where the present invention is applied to formation of a multilayer interconnect structure by dual Damascene process. Hereunder the "trench-first" process is adopted as an example of forming a metal interconnect and a via plug. In this embodiment, the same numerals are given to components that are identical to those of the first embodiment, and description thereof may be omitted.

Figure 6:
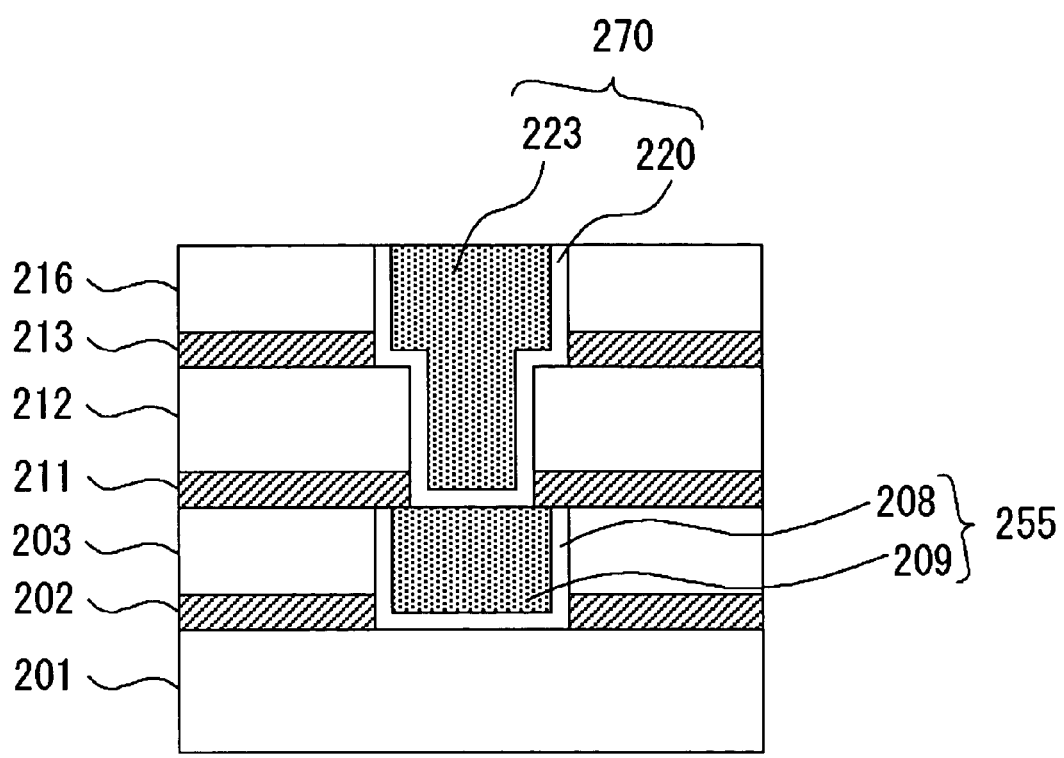
FIG. 6 is a schematic cross-sectional view showing a constitution of a semiconductor device according to an embodiment of the present invention.

FIG. 6 is a schematic cross-sectional view showing a constitution of a semiconductor device according to the second embodiment.

In this embodiment the semiconductor device 200 has, as in the first embodiment, a multilayer structure constituted of the underlying insulating film 201, etch-stopper film 202, first interconnect insulating film 203, etch-stopper film 211, interlayer insulating film 212, etch-stopper film 213, and second interconnect insulating film 216 layered in this sequence. Here, the interconnect 255 constituted of the barrier film 208 and the interconnect metal film 209 is formed through the etch-stopper film 202 and the first interconnect insulating film 203. Also, the upper interconnect 270 (and a via plug) constituted of the barrier film 220 and the interconnect metal film 223 is formed through etch-stopper film 211, the interlayer insulating film 212, the etch-stopper film 213, and the second interconnect insulating film 216.

Now a method of manufacturing the semiconductor device according to this embodiment will be described. FIGS. 7A to 7D are schematic cross-sectional views showing a formation process of an upper interconnect 270 of the semiconductor device shown in FIG. 6.

Figure 7A:
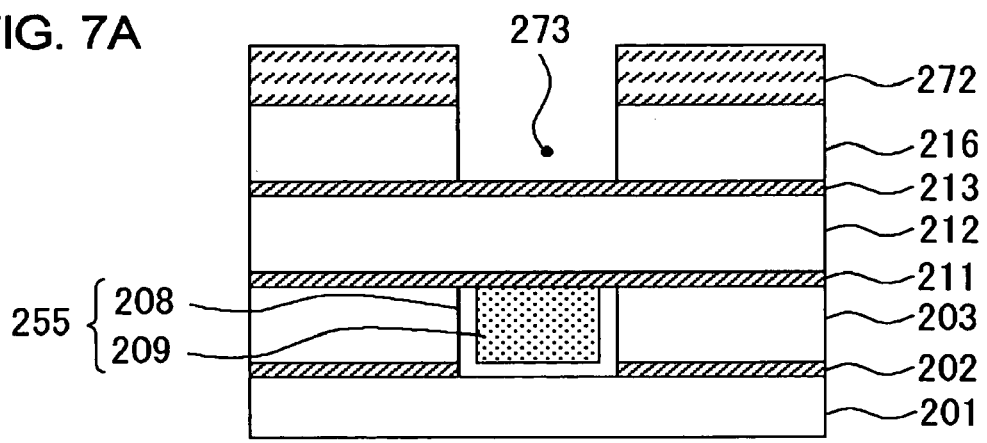
FIGS. 7A to 7D are schematic cross-sectional views showing a manufacturing process of a semiconductor device according to an embodiment of the present invention.
Figure 7B:
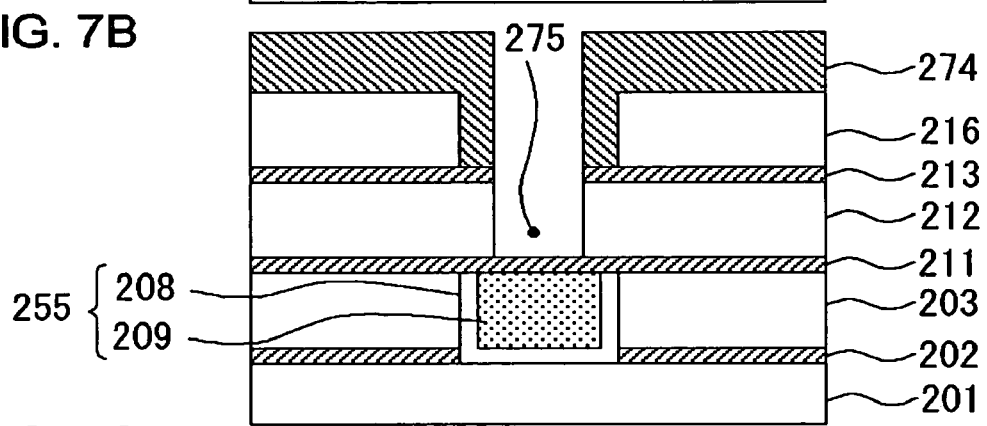

In this embodiment, first a resist film 272 is formed on the second insulating film 216. By a known lithography and etching technique, an interconnect trench 273 is formed through the second insulating film 216 and the resist film 272 under control of the etching control system 400 in deciding an etching endpoint (FIG. 7A). Meanwhile, it is also preferable to form an anti-reflection film (not shown) under the resist film 272 for performing better controlled patterning by the resist film 272. Then the resist film 272 used for forming the interconnect trench 273 is removed, and another resist film 274 is formed on the second insulating film 216 so as to fill in the interconnect trench 273. A via hole 275 is then formed through the etch-stopper film 213, the interlayer insulating film 212 and the etch-stopper film 211 at a predetermined position on the resist film 274, by a known lithography and etching technique, again under control of the etching control system 400 in deciding an etching endpoint (FIG. 7B).

Figure 7C:
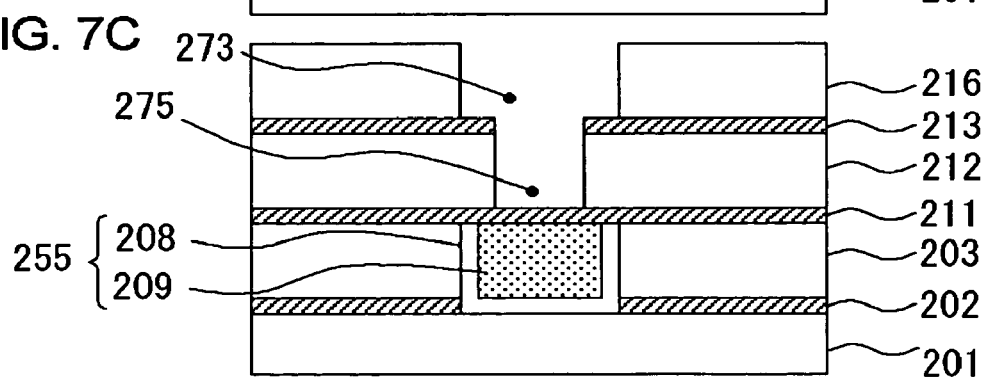
Figure 7D:
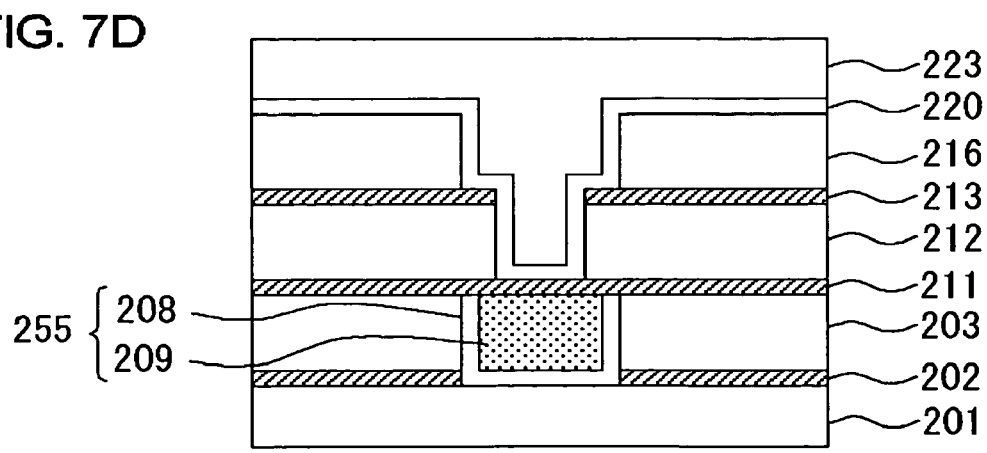

Thereafter the resist film 274 is removed. At this stage, the via hole 275 and the interconnect trench 273 are successively formed on the interconnect 255 (FIG. 7C). Then the barrier film 220 is formed by sputtering inside the via hole 275 and the interconnect trench 273. Following the above the interconnect metal film 223 is formed, for example by electrolytic plating, on the barrier film 220 so as to fill in the via hole 275 and the interconnect trench 273 (FIG. 7D). Then an excess of the barrier film 220 and of the interconnect metal film 223 formed outside the interconnect trench 273 is removed by CMP. In this way the semiconductor device 200 as shown in FIG. 6 is obtained. According to this embodiment also, since an etching endpoint of the insulating film and the etch-stopper film is determined by the etching control system 400 (see FIG. 4), the etching process can be precisely performed. Consequently, an excessive etching in an interconnect trench or a via hole can be prevented, and control of interconnect resistance becomes easier. Also, even in case where a thickness of an etch-stopper film or a insulating film on or under the etch-stopper film is not constant, the etching endpoint can be individually determined by the etching control system 400 according to a thickness of each film, thereby achieving high precision in the overall etching process. Furthermore since the endpoint is detected through plasma emission intensity at a plurality of wavelengths, the endpoint can be distinctly detected even though intensity variation at each single wavelength is scarce.

Third Embodiment

The third embodiment also represents a case where the present invention is applied to formation of a multilayer interconnect structure by dual Damascene process, as in the second embodiment. The difference is that the "via-first" process is adopted as an example of forming a metal interconnect and a via plug. In this embodiment, the same numerals are given to components that are identical to those of the first and the second embodiments, and description thereof may be omitted.

In this embodiment also, the semiconductor device 200 has the same structure as that of the second embodiment shown in FIG. 6.

Figure 8A:
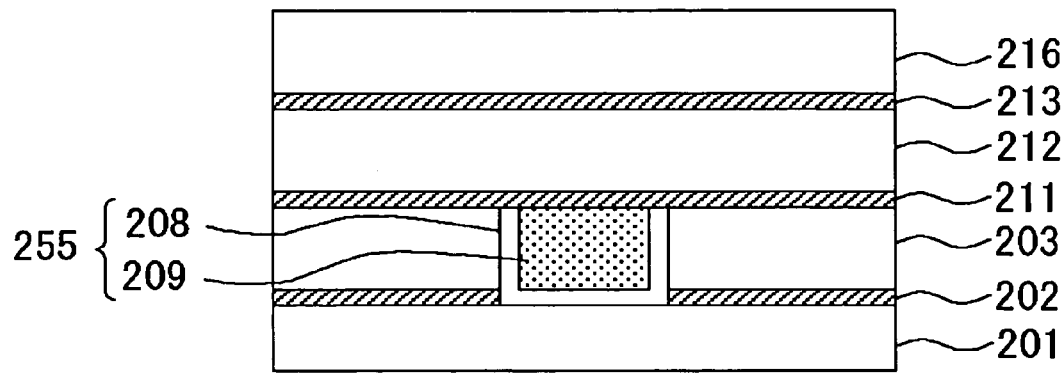
FIGS. 8A to 8C are schematic cross-sectional views showing a manufacturing process of a semiconductor device according to an embodiment of the present invention.
Figure 8B:
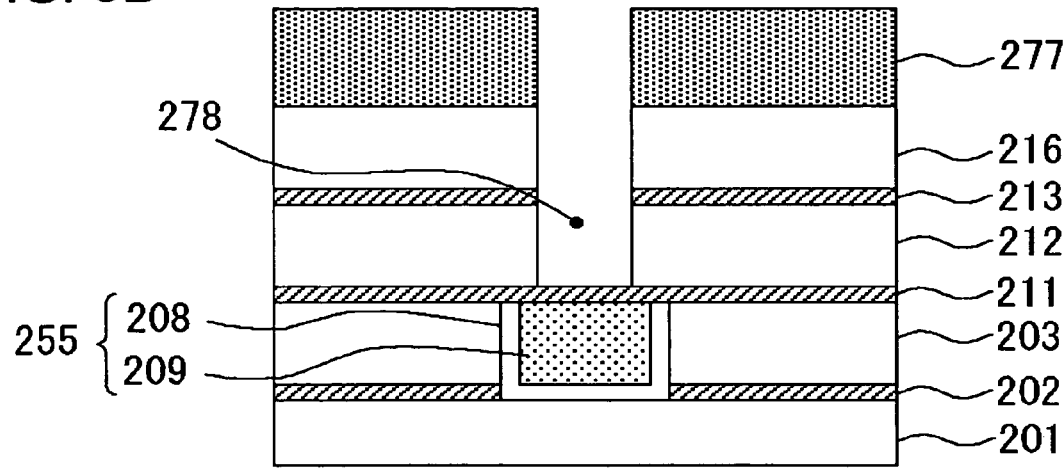
Figure 8C:
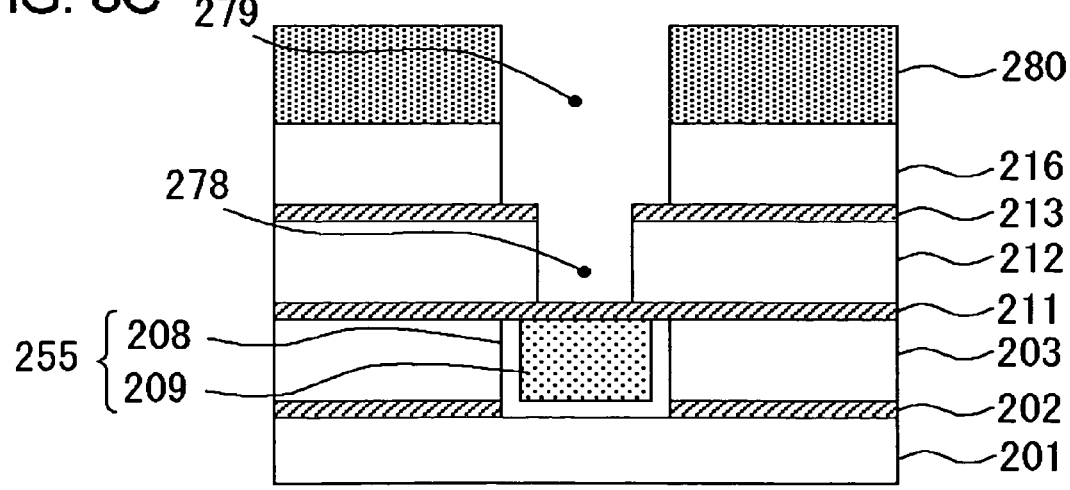

Hereunder a method of manufacturing the semiconductor device according to this embodiment will be described. FIGS. 8A to 8C are schematic cross-sectional views showing another formation process of the upper interconnect 270 of the semiconductor device shown in FIG. 6.

First, the etch-stopper film 211, the interlayer insulating film 212, the etch-stopper film 213 and the second insulating film 216 are deposited in this sequence on the lower interconnect 255 (FIG. 8A). During this process, it is preferable to perform CMP for planarizing the surface of the interlayer insulating film 212 upon forming the same, in order to level off an uneven surface formed through a preceding CMP process performed when forming the lower interconnect 255. As a result, the respective layers can be maintained sufficiently planarized through the subsequent formation process of the multilayer interconnect structure, thereby enabling stable manufacturing of the semiconductor device at a high precision level.

Then a resist film 277 is formed on the second insulating film 216. By a known lithography and etching technique, a via hole 278 is then formed through the second insulating film 216, the etch-stopper film 213 and the interlayer insulating film 212, under control of the etching control system 400 in deciding an etching endpoint as in the first embodiment (FIG. 8B).

After the above the resist film 277 utilized for defining the via hole 278 is removed, and then a resist film 280 is formed on the second insulating film 216 by a known lithography and etching technique, again under control of the etching control system 400 in deciding an etching endpoint (FIG. 8C).

Thereafter the resist film 280 is removed, and the etch-stopper film 211 at a bottom portion of the via hole 278 is removed by etching. In this process also, the etching control system 400 controls the etching endpoint. Then the barrier film 220 and the interconnect metal film 223 are formed in a similar manner to the method described in the second embodiment referring to FIG. 7D. Finally an excess of the barrier film 220 and of the interconnect metal film 223 formed outside the interconnect trench 279 is removed by CMP. In this way a semiconductor device 200 as the one shown in FIG. 6 is obtained. According to this embodiment also, since an etching endpoint of the insulating film and the etch-stopper film is determined by the etching control system 400 (see FIG. 4), the etching process can be precisely performed. Consequently, an excessive etching in an interconnect trench or a via hole can be prevented, and control of interconnect resistance becomes easier. Also, even in case where a thickness of an etch-stopper film or a insulating film on or under the etch-stopper film is not constant, the etching endpoint can be individually determined by the etching control system 400 according to a thickness of each film, thereby achieving high precision in the overall etching process. Furthermore since the endpoint is detected through plasma emission intensity at a plurality of wavelengths, the endpoint can be distinctly detected even though intensity variation at each single wavelength is scarce.

Fourth Embodiment

The fourth embodiment also represents a case where the present invention is applied to formation of a multilayer interconnect structure by dual Damascene process, as in the second and third embodiments. The difference is that the so-called "middle-first" process is adopted as an example of forming an interconnect and a via plug. In this embodiment, the same numerals are given to components that are identical to those of the first to the third embodiments, and description thereof may be omitted.

In this embodiment also, the semiconductor device 200 has the same structure as that of the second embodiment shown in FIG. 6.

Hereunder a method of manufacturing the semiconductor device according to this embodiment will be described. FIGS. 9A to 9D are schematic cross-sectional views showing another formation process of the upper interconnect 270 of the semiconductor device shown in FIG. 6.

Figure 9A:
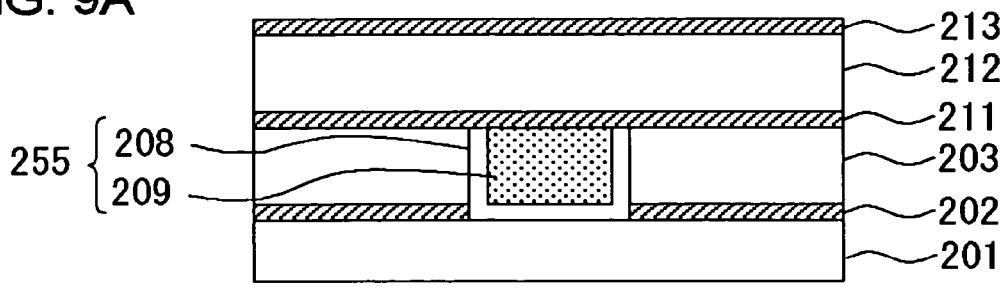
FIGS. 9A to 9D are schematic cross-sectional views showing a manufacturing process of a semiconductor device according to an embodiment of the present invention.

First, the etch-stopper film 211, the interlayer insulating film 212 and the etch-stopper film 213 are sequentially deposited on the lower interconnect 255 (FIG. 9A).

Figure 9B:
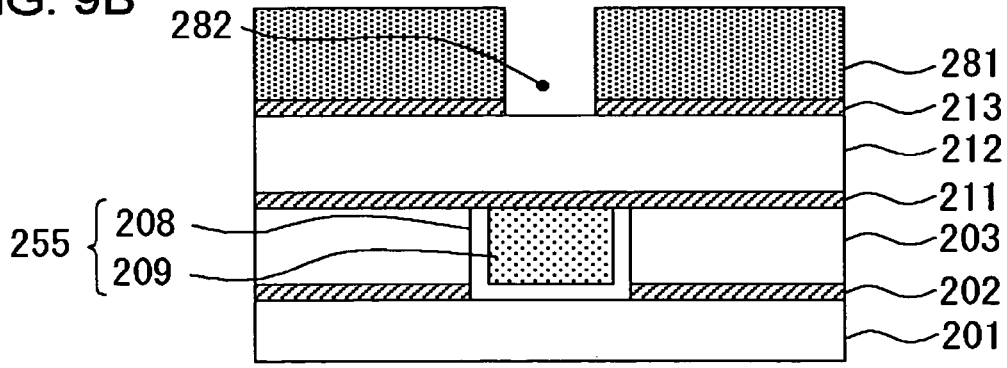

A resist film 281 is then formed on the etch-stopper film 213, after which a portion of the etch-stopper film 213 where a via hole 282 is to be located is removed by a known lithography and etching technique, under control of the etching control system 400 in deciding an etching endpoint as in the first embodiment (FIG. 9B).

Figure 9C:
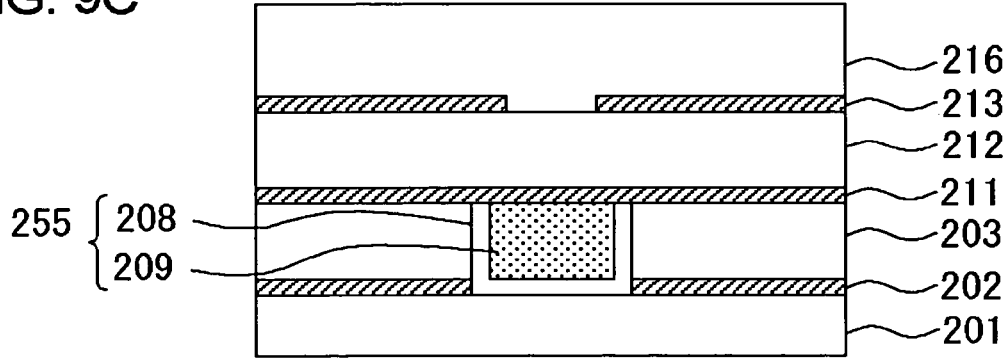

Then the resist film 281 is removed, and the second insulating film 216 is formed on the etch-stopper film 213 (FIG. 9C).

Figure 9D:
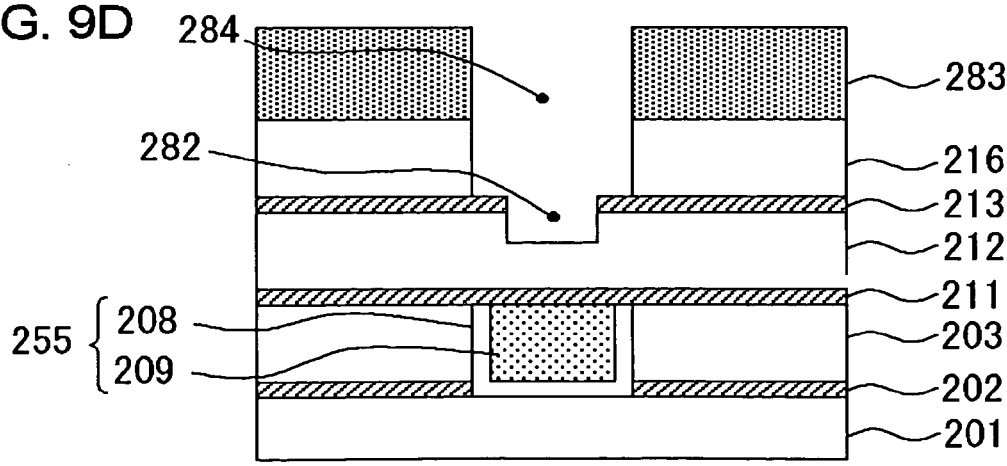

Thereafter a resist film 283 is formed on the second insulating film 216, following which an interconnect trench 284 is formed on the second insulating film 216 by a known lithography and etching technique, again under control of the etching control system 400 in deciding an etching endpoint. During this process, the etching is still continued after the interconnect trench 284 being defined with the progress of the etching has reached the etch-stopper film 213, to further define the via hole 282 (FIG. 9D). Then the etch-stopper film 211 is removed and the barrier film 220 and the interconnect metal film 223 are formed as in the third embodiment. Finally an excess of the barrier film 220 and of the interconnect metal film 223 formed outside the interconnect trench 284 is removed by CMP. In this way a semiconductor device similar to the one shown in FIG. 6 is obtained. According to this embodiment also, since an etching endpoint of the insulating film and the etch-stopper film is determined by the etching control system 400 (see FIG. 4), the etching process can be precisely performed. Consequently, an excessive etching in an interconnect trench or a via hole can be prevented, and control of interconnect resistance becomes easier. Also, even in case where a thickness of an etch-stopper film or a insulating film on or under the etch-stopper film is not constant, the etching endpoint can be individually determined by the etching control system 400 according to a thickness of each film, thereby achieving high precision in the overall etching process. Furthermore since the endpoint is detected through plasma emission intensity at a plurality of wavelengths, the endpoint can be distinctly detected even though intensity variation at each single wavelength is scarce.

EXAMPLES

The etching control system 400 will be specifically described hereunder based on the following examples, however it is to be understood that the present invention is not limited to these examples.

To start with, a multilayer structure was formed, which was constituted of an $SiO_2$ film (thickness 200 nm), an SiCN film (thickness 50 nm), an $SiO_2$ film (thickness 300 nm) and a resist film are formed in this sequence.

Example 1

Plasma etching was performed on the upper $SiO_2$ film of the above multilayer structure utilizing the etching apparatus (ambient gas: $C_4F_8$, Ar, $O_2$, pressure: 40 mTorr, bias: 1000W), and an etching endpoint was detected at an interface between the $SiO_2$ film and the SiCN film formed thereunder. The detection of the endpoint was performed by OES utilizing a spectroscope (photomultiplier). Results are shown in FIGS. 10A and 10B.

Figure 10A:
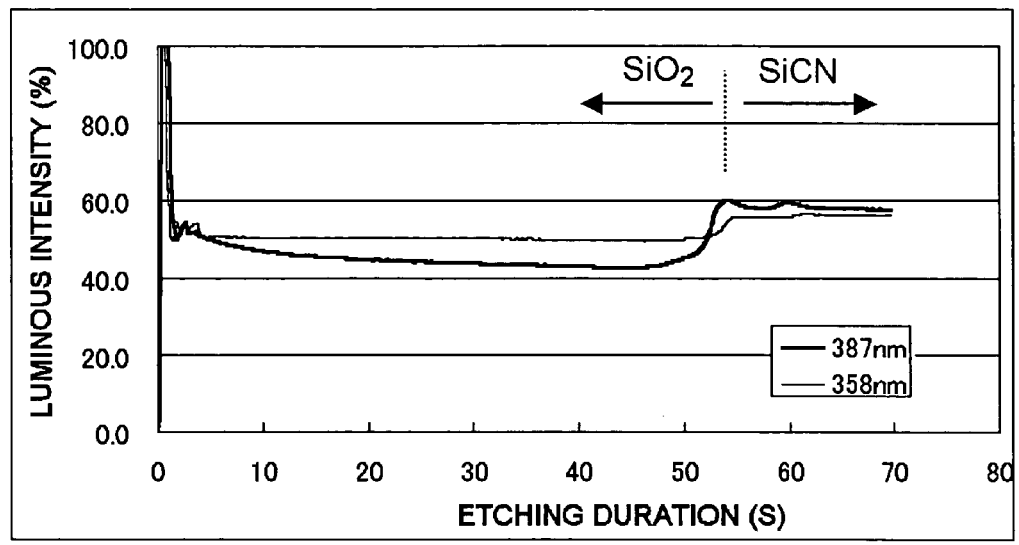
FIGS. 10A and 10B are line graphs showing a relation between an etching duration and a luminous intensity in an embodiment of the present invention.
Figure 10B:
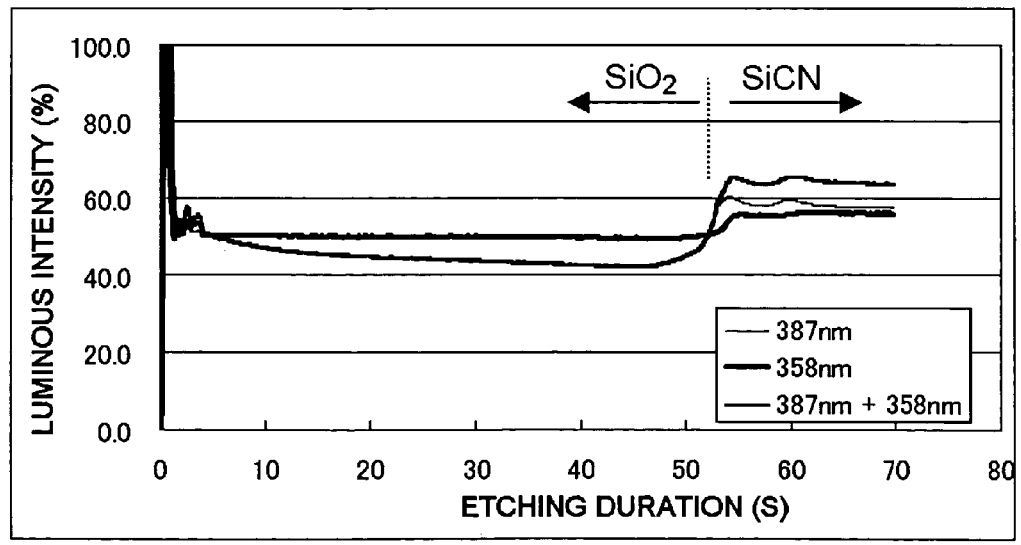

FIG. 10A is a line graph showing a relation between an etching duration and luminous intensity at a wavelength λ of 358 nm and 387 nm. In this example, sensitivity was adjusted such that luminous intensity immediately after start of the etching (after 5 seconds) becomes 50%. FIG. 10B is a line graph showing luminous intensity obtained by deducting a value corresponding to the initial 50% from a total of the luminous intensity of these two wavelengths (λ=358 nm and λ=387 nm). As is apparent in view of FIG. 10B, utilizing a total luminous intensity of the two wavelengths permits more distinct detection of an interface between the $SiO_2$ film and the SiCN film.

Example 2

After removing the upper $SiO_2$ film of the above multilayer structure by plasma etching, the SiCN film was also plasma-etched by the same etching apparatus (ambient gas: $CHF_3$, Ar, $O_2$, pressure: 20 mTorr, bias: 100 W), and an etching endpoint was detected at an interface between the SiCN film and the $SiO_2$ film formed thereunder. The detection of the endpoint was performed by OES utilizing a spectroscope (photomultiplier). Results are shown in FIGS. 11A and 11B.

Figure 11A:
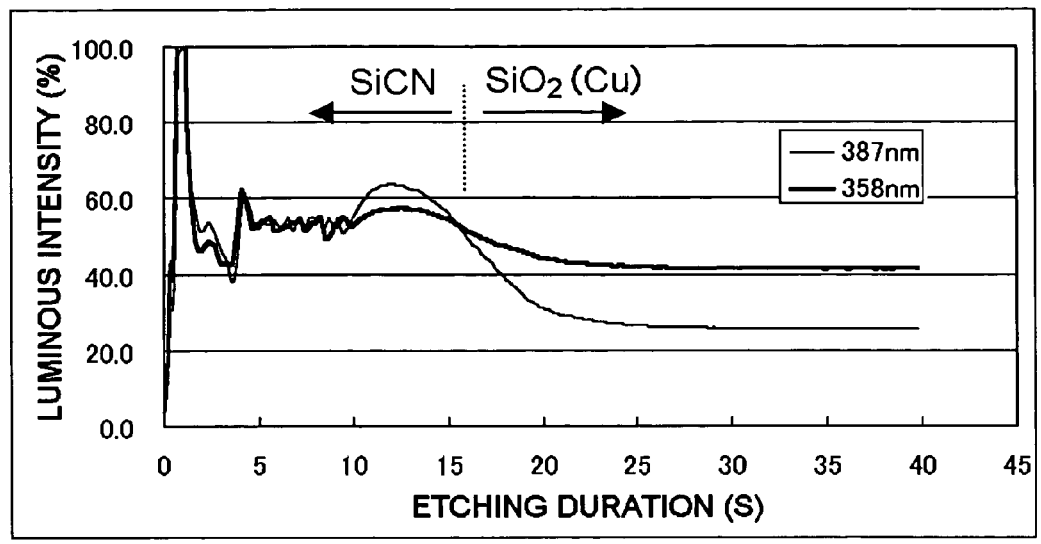
FIGS. 11A and 11B are line graphs showing a relation between an etching duration and a luminous intensity in an embodiment of the present invention.
Figure 11B:
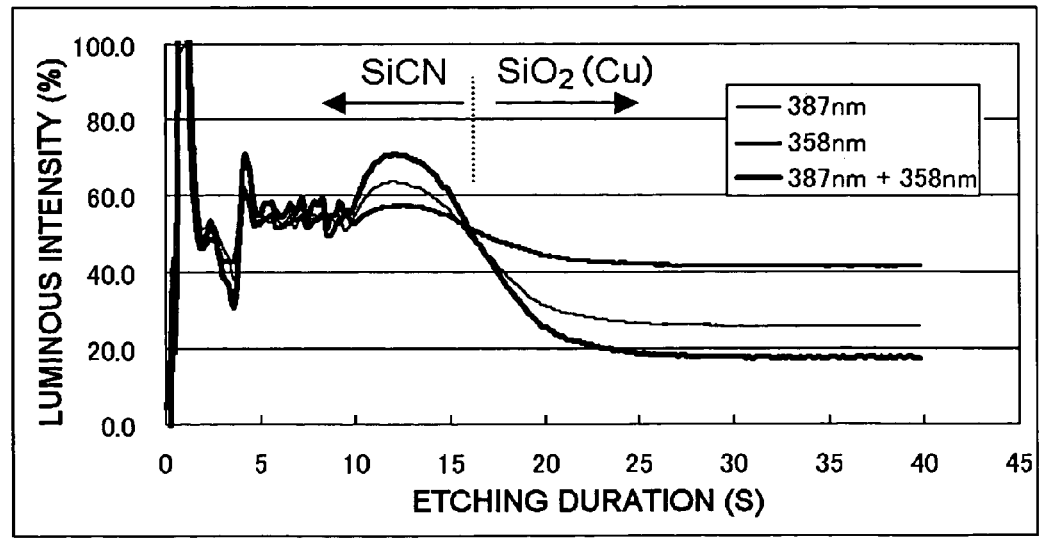
Figure 12A:
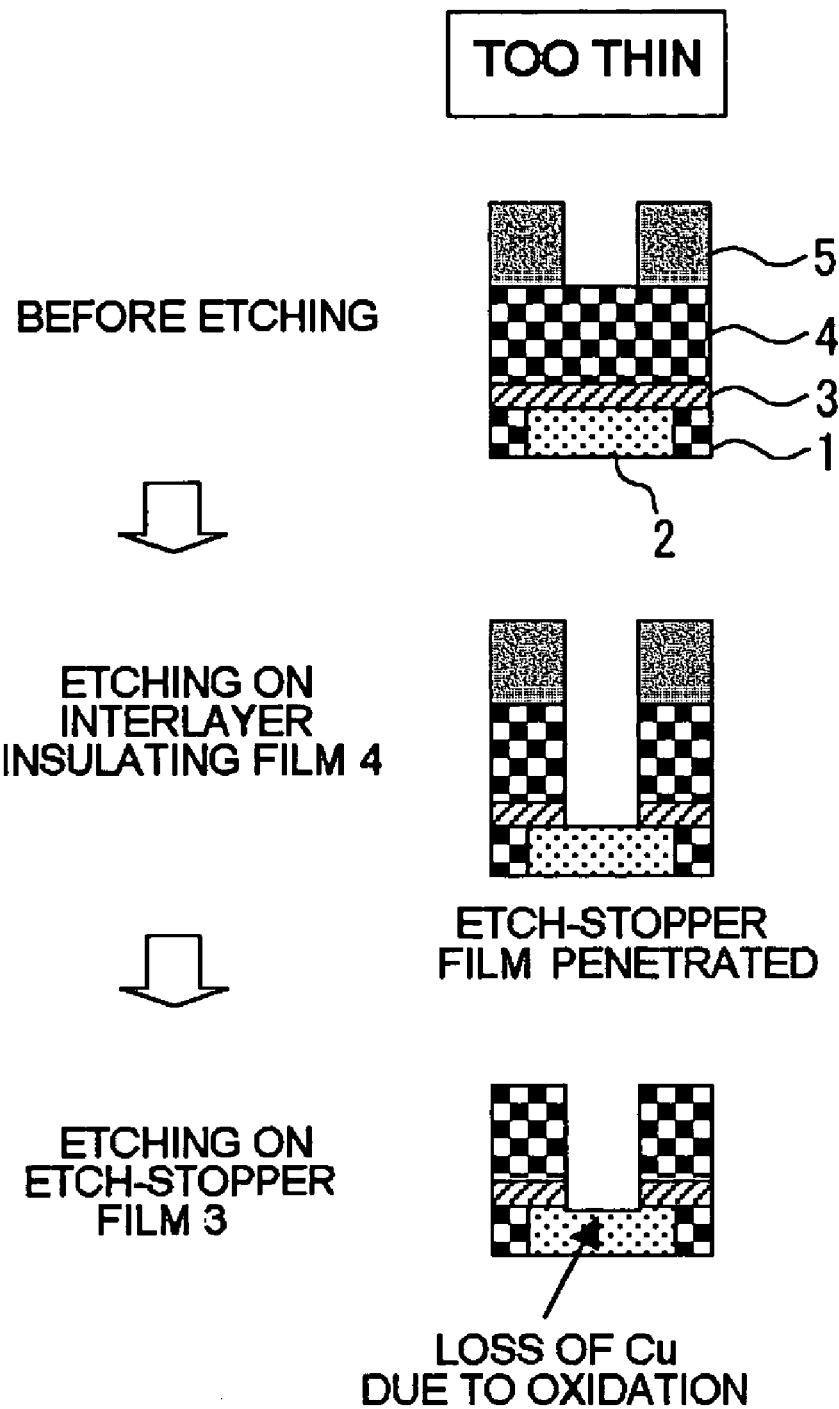
FIGS. 12A to 12C are schematic cross-sectional drawings for explaining a problem in a conventional etching process.
Figure 12B:
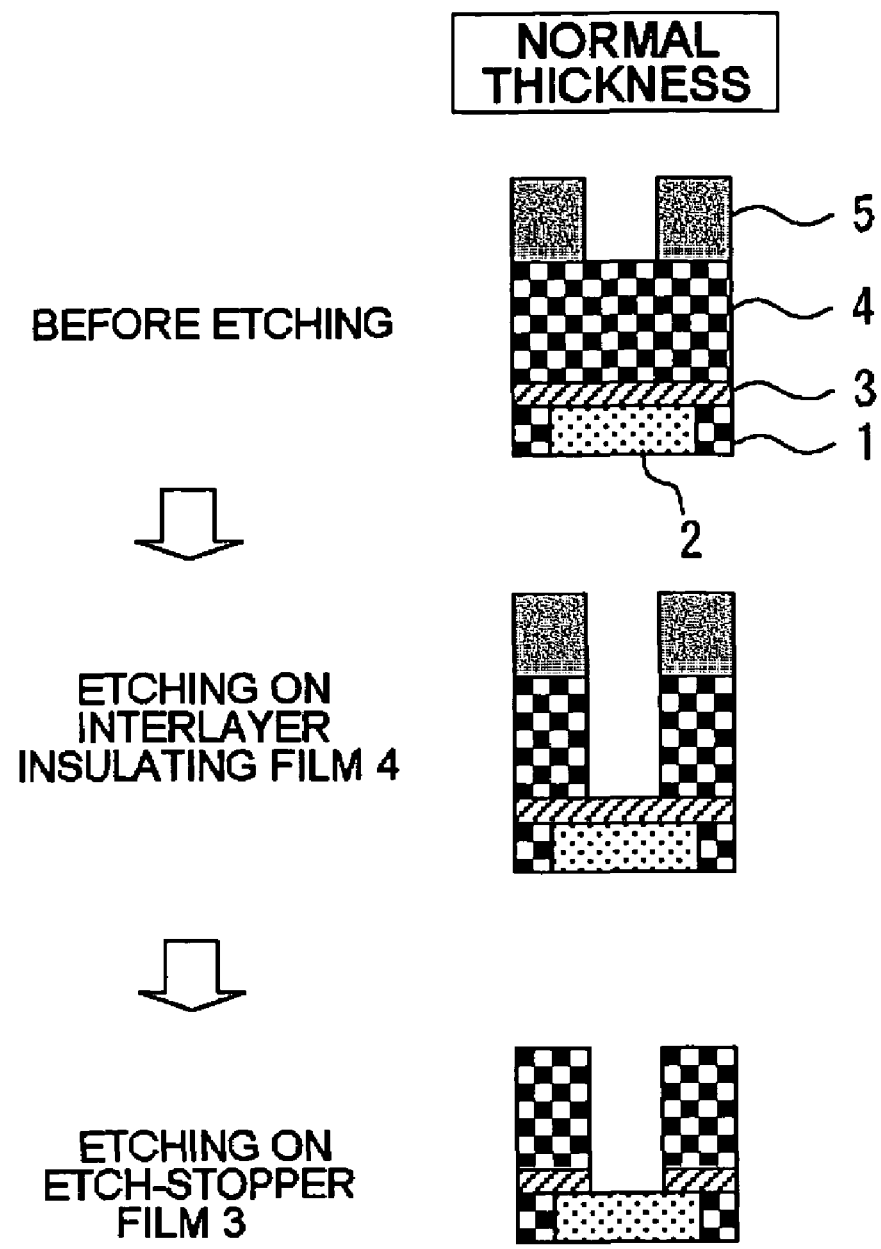
Figure 12C:
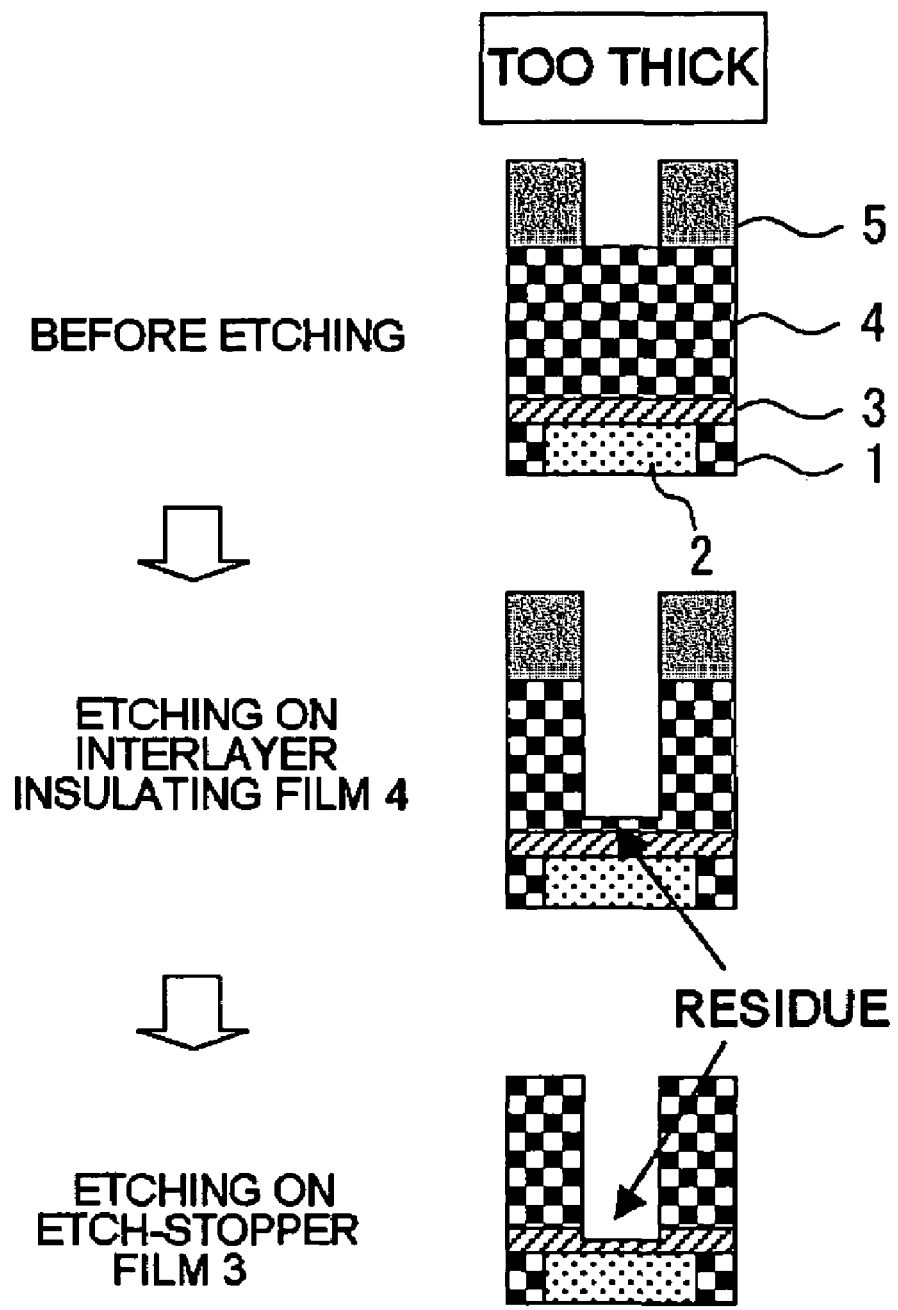

FIG. 11A is a line graph showing a relation between an etching duration and luminous intensity at a wavelength λ of 358 nm and 387 nm. In this example, sensitivity was adjusted such that luminous intensity immediately after start of the etching (after 10 seconds) becomes 50%. FIG. 11B is a line graph showing luminous intensity obtained by deducting a value corresponding to the initial 50% from a total of the luminous intensity of these two wavelengths (λ=358 nm and λ=387 nm). As is apparent in view of FIG. 11B, utilizing a total luminous intensity of the two wavelengths permits more distinct detection of an interface between the SiCN film and the $SiO_2$ film.

Throughout the foregoing passages the present invention has been described referring to the embodiments and the examples. It is to be understood that these embodiments are only exemplifying and that it is apparent to those skilled in the art that various modifications can be made to the respective constituents or processing steps or combinations thereof, without departing from the spirit and scope of the present invention. Following are a few examples of such nature.

In the foregoing embodiments and examples the emission bands that have an intensity peak at two different wavelengths of approx. 358 nm and approx. 387 nm are adopted as an object of detection, however three or more wavelengths may be adopted. The more number of wavelengths are detected, the more precisely an endpoint of a plasma dry etching process can be determined. Also, in case where the wavelengths to be detected decrease, an absolute value of variation may be employed.

Further, while the foregoing examples represent the cases where an endpoint is detected utilizing a total luminous intensity of the two wavelengths, it is also possible to detect an endpoint based on various correlations of a plurality of wavelengths, such as utilizing a wavelength ratio among a plurality of wavelengths (a value obtained by dividing luminous intensity at a wavelength by that of another wavelength), or utilizing a total or a ratio among a plurality of wavelengths granting a greater weight to luminous intensity of a certain wavelength than that of another wavelength, etc.

What is claimed is:

1. A method of manufacturing a semiconductor device, comprising:
   forming a film on a semiconductor substrate;
   performing a dry etching process for removing said film while monitoring a plasma emission at a plurality of wavelengths;
   wherein said performing said dry etching process includes determining an endpoint of said dry etching process based on a change of luminous intensity obtained by a correlation of a plurality of luminous intensities of the plasma emission at said plurality of wavelengths wherein the correlation includes a ratio of the plurality of luminous intensities that grants a greater weight to the luminous intensity of one of the plurality of wavelengths than that of another of the plurality of wavelengths.

2. The method as set forth in claim 1, wherein said film contains nitrogen.

3. The method as set forth in claim 1, wherein said film contains one of SiCN and SiON.

4. The method as set forth in claim 1, wherein said film is an insulating film provided on another film containing nitrogen in direct contact therewith.

5. The method as set forth in claim 1, wherein said film is an insulating film provided on another film containing one of SiCN and SiON in direct contact therewith.

6. The method as set forth in claim 4, wherein said insulating film does not contain nitrogen.

7. The method as set forth in claim 5, wherein said insulating film does not contain nitrogen.

8. The method as set forth in claim 1, wherein said plurality of different wavelengths is an emission band having a luminous intensity peak in the proximity of 358 nm and in an emission band having a luminous intensity peak in the proximity of 387 nm.

9. A method of manufacturing a semiconductor device including a nitrogen-containing film formed on a semiconductor substrate and a film formed on said nitrogen-containing film in direct contact therewith, comprising:
   performing a dry etching process for removing said film at least until reaching an interface with said nitrogen-containing film while monitoring plasma emission at a plurality of wavelengths;
   wherein said performing said dry etching process includes determining an endpoint based on a change of luminous intensity obtained by a correlation of a plurality of luminous intensities of the plasma emission at said plurality of wavelengths wherein the correlation includes a ratio of the plurality of luminous intensities that grants a greater weight to the luminous intensity of one of the plurality of wavelengths than that of another of the plurality of wavelengths.

10. A method of manufacturing a semiconductor device including a film formed on a semiconductor substrate and a nitrogen-containing film formed on said film in direct contact therewith, comprising:
   performing a dry etching process for removing said nitrogen-containing film at least until reaching an interface with said film while monitoring plasma emission at a plurality of wavelengths;
   wherein said performing said dry etching process includes determining an endpoint based on a change of luminous intensity obtained by a correlation of a plurality of luminous intensities of the plasma emission at said plurality of wavelengths wherein the correlation includes a ratio of the plurality of luminous intensities that grants a greater weight to the luminous intensity of one of the plurality of wavelengths than that of another of the plurality of wavelengths.

11. The method as set forth in claim 9, wherein said film does not contain nitrogen.

12. The method as set forth in claim 10, wherein said film does not contain nitrogen.

13. A method of manufacturing a semiconductor device, comprising the steps of:
   forming a film on a substrate;
   starting a dry etching of the film in a dry etching system;
   monitoring a plasma emission from the dry etching system;
   detecting an endpoint of the dry etching based on a correlation of intensities of the monitored plasma emission at predetermined wavelengths; and
   ending the dry etching of the film,
   wherein intensities of at least two wavelengths are monitored at said monitoring the plasma emission wherein the correlation includes a ratio of the plurality of luminous intensities that grants a greater weight to the luminous intensity of one of the plurality of wavelengths than that of another of the plurality of wavelengths.

14. The method as set forth in claim 1, wherein the correlation includes a total of the plurality of luminous intensities.

* * * * *